(12) United States Patent
Kambe et al.

(10) Patent No.: US 6,979,890 B2
(45) Date of Patent: Dec. 27, 2005

(54) INTERMEDIATE SUBSTRATE

(75) Inventors: Rokuro Kambe, Nagoya (JP); Tetsuya Kasiwagi, Aichi (JP); Yukihiro Kimura, Nagoya (JP); Yasuhiro Sugimoto, Konan (JP); Kazuhiro Suzuki, Kasugai (JP)

(73) Assignee: NGK Spark Plug, Ltd., Aichi (JP)

( * ) Notice: Subject to any disclaimer, the term of this patent is extended or adjusted under 35 U.S.C. 154(b) by 0 days.

(21) Appl. No.: 11/127,192

(22) Filed: May 12, 2005

(65) Prior Publication Data

US 2005/0263867 A1    Dec. 1, 2005

(30) Foreign Application Priority Data

May 28, 2004  (JP) .............................. 2004-160224

(51) Int. Cl.[7] .......................................... H01L 23/02
(52) U.S. Cl. ...................................... 257/678; 336/200
(58) Field of Search .......................... 336/83, 200–208, 336/232; 257/531, 678, 691–697

(56) References Cited

U.S. PATENT DOCUMENTS

| | | | | |
|---|---|---|---|---|
| 5,708,296 | A * | 1/1998 | Bhansali | 257/698 |
| 5,714,801 | A * | 2/1998 | Yano et al. | 257/691 |
| 5,898,217 | A * | 4/1999 | Johnston | 257/691 |
| 6,008,534 | A * | 12/1999 | Fulcher | 257/691 |
| 6,828,666 | B1 * | 12/2004 | Herrell et al. | 257/691 |

FOREIGN PATENT DOCUMENTS

| | | |
|---|---|---|
| EP | 1 041 631 A2 | 10/2000 |
| JP | 2000-349225 | 12/2000 |
| JP | 2001-035966 | 2/2001 |
| JP | 2002-204071 | 7/2002 |

* cited by examiner

Primary Examiner—Tuyen T Nguyen
(74) Attorney, Agent, or Firm—Stites & Harbison PLLC; Ross F. Hunt, Jr.

(57) ABSTRACT

An intermediate substrate is provided which reduces the effect of the difference in the coefficients of linear expansion between the terminals of the substrate and those of a semiconductor integrated circuit device, and which thus lowers the likelihood of disconnection due to thermal stress. The intermediate substrate, which is a planar member made of a polymeric material, includes a substrate core including a main core body having formed therein a sub-core compartment, and a ceramic sub-core section accommodated in the compartment. A first terminal array on the first principal surface side includes two types of terminals, functioning either as power source terminals or ground terminals, and a signal terminal. The array occupies an area entirely included within an orthogonally projected region of the sub-core section projected onto a reference plane parallel to the planar surface of the substrate core.

12 Claims, 11 Drawing Sheets

O : signal terminal
● : power source terminal
⊘ : ground terminal

INTERMEDIATE SUBSTRATE

BACKGROUND OF THE INVENTION

1. Field of the Invention

The present invention relates to an intermediate substrate and, more particularly, to an intermediate substrate for a semiconductor integrated circuit device.

2. Description of the Related Art

Semiconductor integrated circuit devices operating at high speeds, such as CPUs and other LSIs, have been much reduced in size in recent years, whereas the number of signal terminals, power source terminals and ground terminals has been increasing, and the terminal interval, i.e., the spacing between terminals, is becoming smaller or narrower. A terminal array on the integrated circuit side, which is typically comprised of packed multiple terminals, is generally connected to the mother board side of a flip-chip form, but because the terminal interval of the integrated circuit side terminal is significantly different from that of the mother board side terminal array, an intermediate substrate is required to accommodate this difference.

Such intermediate substrates include the so-called organic package substrate, which comprises a laminated wiring section comprising alternately laminated dielectric layer(s) made of a polymeric material and conductor layer(s), and a terminal array for flip-chip connection disposed on a first principal surface formed in the dielectric layer of the laminated wiring section. The laminated wiring section formed on a substrate core is principally comprised of a polymeric material such as an epoxy resin reinforced with glass fibers. If there is a substantial gap between the IC side terminal interval and the terminal interval at the main substrate (mother board) side at the point of connection, the wiring and via disposition pattern for providing the necessary conversion tends to be both fine (very dense) and complex. Further, an additional problem is presented by the increase in the number of terminals. However, the organic package substrate is advantageous because such a fine and complex wiring pattern can be easily formed with high precision, using a combination of photolithography technology and plating technology.

However, since the organic package substrate is comprised of a polymeric material, when the substrate is connected to the main substrate (for example, the mother board) which is principally made of a polymeric material, and taking into account the thermal history of the solder reflow operation or the like, the difference in the coefficient of linear expansion between the semiconductor integrated circuit device, which is principally made of silicon (having a coefficient of linear expansion of, for example, 2 to 3 ppm/° C.), and the main substrate (having a coefficient of linear expansion of, for example, 17 to 18 ppm/° C.) cannot be accommodated, and thus may lead to disconnection caused by solder peeling and/or other defects.

Japanese unexamined patent publication No. 2001-035966 discloses a ceramic package substrate principally comprised of ceramics. By using such a ceramic package substrate, the difference in coefficient of linear expansion between the semiconductor integrated circuit device and the main substrate connected by a flip-chip connection, can be substantially eliminated, and defects such as disconnection caused by thermal stress at the solder junction between the semiconductor integrated circuit device and the associated terminals can be effectively prevented.

However, because, in the ceramic package substrate, the wiring is provided by printing and baking a metal paste, it is hard to form fine wiring patterns with high integration, in contrast to organic package substrates which are formed using photolithography technology. Thus, the ceramic package substrate is limited in its ability to reduce the terminal interval at the semiconductor integrated circuit device side. Hence, a multilayer substrate connection structure may be provided by connecting a first intermediate substrate made of an organic package substrate at the main substrate side, connecting a second "relay" substrate made of ceramic to the first intermediate substrate, and connecting a semiconductor integrated circuit device to the second relay substrate. However, as the number of intermediate substrates is increased, the height dimension of the substrate connection structure is increased. This is a serious disadvantage because of the current demand for size reduction. In addition, the number of steps required in the connection process is increased, and production efficiency is sacrificed.

SUMMARY OF THE INVENTION

It is hence an object of the invention to provide an intermediate substrate which is substantially immune from disconnection by thermal stress, which lowers overall height of the substrate connection structure, and which reduces the number of connection steps.

To achieve the aforementioned object and others, the intermediate substrate of the invention comprises:

a substrate core composed of a core main body made of polymeric material which can, for example, comprise a material including fillers such as ceramic fibers and particles) formed in a plate, and opening a sub-core compartment in such a manner as to decrease the own thickness in the first principal surface, and a sub-core section made of a material smaller in coefficient of linear expansion than the core main body formed in a plate, and accommodated in the sub-core compartment so as to be matched with the core main body in the thickness direction, a first terminal array composed of a first side first type terminal and a first side second type terminal formed at the first principal surface side of the substrate core, and functioning as power source terminal and ground terminal, and of a first side signal terminal, and a second terminal array composed of a second side first type terminal and a second side second type terminal formed at the second principal surface side of the substrate core, and conducting respectively with the first side first type terminal and the first side second type terminal, and of second side signal terminal conducting with the first side signal terminal, in which the first terminal array is formed in a relative position overlapping with the projection region of the sub-core section in orthogonal projection on a reference plane parallel to the plate surface of the substrate core.

According to this configuration, because the sub-core section is made of a material having a smaller coefficient of linear expansion than that of the main core body made of a polymeric material and is "buried" or otherwise fully received in the substrate core so as to overlap with the region of the first terminal array connected to the semiconductor integrated circuit device side by a flip-chip connection, the difference in the coefficient of linear expansion between the terminals in the first terminal array and the semiconductor integrated circuit device side can be sufficiently reduced. As a result, any problem of disconnection because of thermal stress can be substantially suppressed. Moreover, since the sub-core section corresponding to the second intermediate substrate is buried in the core main body corresponding to the first intermediate substrate, the overall height of the connection structure of the semiconductor integrated circuit device and main substrate using the intermediate substrate can be reduced, and the number of connection steps required can also be reduced.

An another embodiment, the intermediate substrate of the invention comprises:

a substrate core, having first and second principal surface sides, comprised of a plate-form main core body made of a polymeric material (preferably including, for example, a material incorporating ceramic fibers and particles), and including a sub-core compartment formed therein so as to decrease the thickness thereof relative to a first planar principal surface, and a plate-form sub-core section made of a material having a coefficient of linear expansion smaller than the core main body formed in a plate, said sub-core section being accommodated in the sub-core compartment and having a thickness matching the overall thickness of said main core body, a first terminal array comprised of a first side, first type terminal and a first side, second type terminal formed at the first principal surface side of the substrate core, and functioning, respectively, as a power source terminal and a ground terminal, and of a first side signal terminal, and a second terminal array comprised of a second side, first type terminal and a second side, second type terminal formed at the second principal surface side of the substrate core, and conductively connected to, respectively, the first side, first type terminal and the first side, second type terminal, and of a second side signal terminal conductively connected to the first side signal terminal, the first terminal array being disposed in a relative position that is entirely included in a projected region of the sub-core section geometrically projected orthogonally onto a reference plane parallel to the planar principal surface of the substrate core.

According to this configuration, since the relevant dimensions of the sub-core section are chosen or adjusted so as to include the entire region of the first terminal array connected to the semiconductor integrated circuit device side by flip-chip connection and the sub-core section is "buried" or otherwise fully received in the substrate core, the difference in the coefficient of linear expansion between all terminals in the first terminal array and the semiconductor integrated circuit device side can be sufficiently reduced. This enables the problem of disconnection between the terminals due to thermal stress to be effectively combated. Moreover, since the sub-core section corresponding to the second intermediate substrate is buried in the main core body corresponding to the first intermediate substrate, the overall height of the connection structure of the semiconductor integrated circuit device and the main substrate using the intermediate substrate can be reduced, and the number of connection steps can be decreased.

The advantages of the invention are enhanced when the sub-core section covers an area equivalent to, or larger than, the area covered by the first terminal array.

The material used for the sub-core section is not particularly important so long as the coefficient of linear expansion thereof is smaller than that of the main core body. However, considering the relatively high coefficient of linear expansion of standard polymeric materials, the sub-core section is preferably made of a ceramic material so as to reduce the effect of the differences in coefficient of linear expansion as compared with the semiconductor integrated circuit device.

In embodiments wherein a ceramic material is used, candidate ceramics used for the ceramic core section include alumina (7 to 8 ppm/° C.) and glass ceramics (borosilicate glass or a compound material comprising lead borosilicate glass with 40 to 60 parts by weight of an inorganic ceramic filler such as alumina). The former has a very small coefficient of linear expansion as compared with other ceramics, and is excellent in reducing the effect of the difference in the coefficient of linear expansion as compared with the associated semiconductor integrated circuit device. Further, by using alumina, and adding additives such as Si, Mn, Ti, Zr, or other elements in Group 2a in the Periodic Table, the baking temperature can be lowered, and the resultant ceramic can be baked simultaneously with a high conductivity material containing Cu. Specific examples of additives include $SiO_2$—$MnO_2$—$TiO_2$—$ZrO_2$—$BaO$—$MgO$, and for this embodiment a suitable baking temperature is 1350° C. or less (typically 1250° C.). On the other hand, glass ceramics are better suited to low temperature baking, and, when forming metal wiring or a via as required, this type of ceramic can be baked simultaneously with a high conductivity metal material of relatively low melting point mainly comprised of Cu or Ag.

In preferred embodiments, the ceramic of the ceramic sub-core section has a Si content of between 68 mass and 99 mass % based on the amount of $SiO_2$, and cation components other than Si are comprised of oxide forming cations for forming oxides having a larger coefficient of linear expansion than $SiO_2$ in a temperature range from room temperature to 200° C., and hence the ceramic can be comprised of an oxide glass material having an average coefficient of linear expansion from 1 ppm/° C. at room temperature to 200° C. adjusted to between 1 ppm/° C. and 7 ppm/° C.

It is noted that the coefficient of linear expansion of $SiO_2$ in the temperature range from room temperature to 200° C. is very small, viz., about 1 ppm/° C., and by making the sub-core section of a glass material containing oxide forming cations for forming oxides having a larger coefficient of linear expansion, the coefficient of linear expansion of the glass material can be freely adjusted to a desired value from 1 ppm/° C. or more, depending on the type and content of the oxide forming cations. As a result, by using a sub-core section comprised of the glass material, a considerable reduction can be effected in the difference in coefficient of linear expansion as compared with the semiconductor integrated circuit device to be mounted, and the reliability of the connection with the semiconductor integrated circuit device provided by the flip-chip connection can be substantially enhanced.

When the semiconductor integrated circuit device to be mounted is a Si semiconductor component, because the coefficient of linear expansion of Si is about 3 ppm/° C., the coefficient of linear expansion of oxide glass material is preferably between 1 ppm/° C. and 6 ppm/° C. or less, and more preferably between 2 ppm/° C. and 5 ppm/° C. On the other hand, when the semiconductor integrated circuit device to be mounted is a compound semiconductor component comprised of a group III–V compound of a lattice matching with that of GaAs, because the coefficient of linear expansion of the semiconductor component is about 5 to 6 ppm/° C., the coefficient of linear expansion of oxide glass material is preferably between about 4 ppm/° C. and 7 ppm/° C. In any event, the thermal shearing due to the difference in the coefficient of linear expansion between the component and substrate has minimal effect on the terminal connection structure with the semiconductor integrated circuit device mounted on the sub-core section, and the probability of the occurrence of defects such as terminal disconnection is substantially decreased.

In this case, if the content of $SiO_2$ in the oxide glass material used in the sub-core section is less than 68 mass %, it is difficult to keep the coefficient of linear expansion of the glass material under 7 ppm/° C., and thus the difference in coefficient of linear expansion from the semiconductor component cannot be sufficiently reduced. Further, if the oxide glass material exceeds 99 mass %, the melting point is elevated, and the manufacturing costs of glass of high quality with less foam residue is increased. It may also be difficult to keep the coefficient of linear expansion of the glass material above 1 ppm/° C.

Further features and advantages of the present invention will be set forth in, or apparent from, the detailed description of preferred embodiments thereof which follows.

DESCRIPTION OF THE PREFERRED EMBODIMENTS

Referring now to the drawings, preferred embodiments of the invention will now be specifically described in connection with these drawings.

Figure 1:
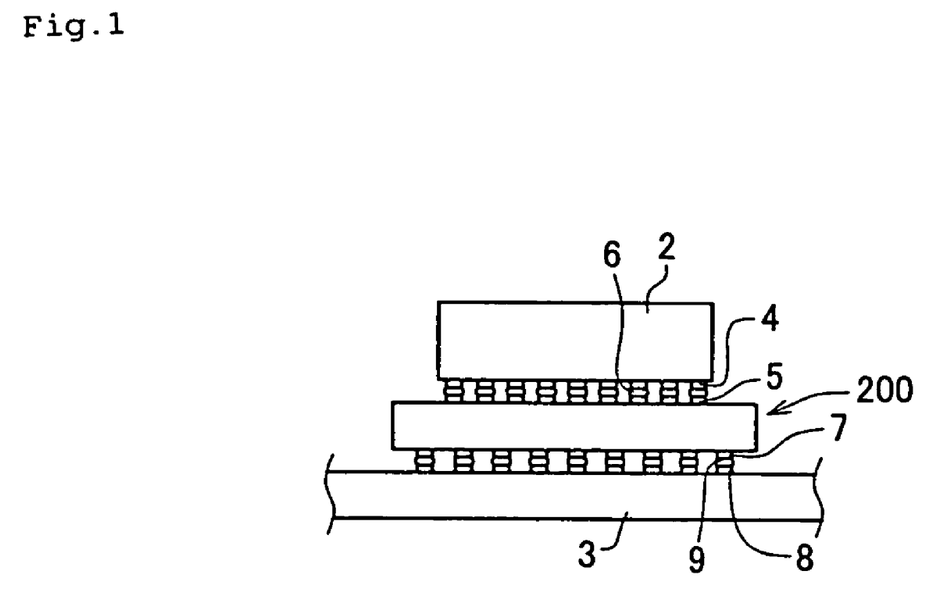
FIG. 1 is a schematic side elevational view showing an example of a mode of use of the intermediate substrate of the invention.

FIG. 1 shows an example of an intermediate substrate 200 in accordance with one embodiment of the invention disposed between a semiconductor integrated circuit device 2 and a main substrate 3. In this embodiment, a first principal surface of a plate member is exposed at the upper side as viewed in FIG. 1, and a second principal surface is exposed at the lower side.

The semiconductor integrated circuit device 2 has a device side terminal array 4 comprised of a plurality of signal terminals, power source terminals, and ground terminals on the second principal surface, and is connected to a first terminal array 5 formed on the first principal surface of an intermediate substrate 200, by a flip-chip connection, by means of a solder junction 6. The main substrate 3 preferably comprises a mother board, or an organic laminated package substrate forming an intermediate substrate of a second stage, and both are principally composed of a reinforced polymeric material using ceramic particles or fibers as a filler. Substrate 3 is connected to a second terminal array 7, formed on the second principal surface of the intermediate substrate 200, by means of a solder junction 9, between a main substrate side terminal array 8 comprised of solder balls or metal pins.

Figure 3:
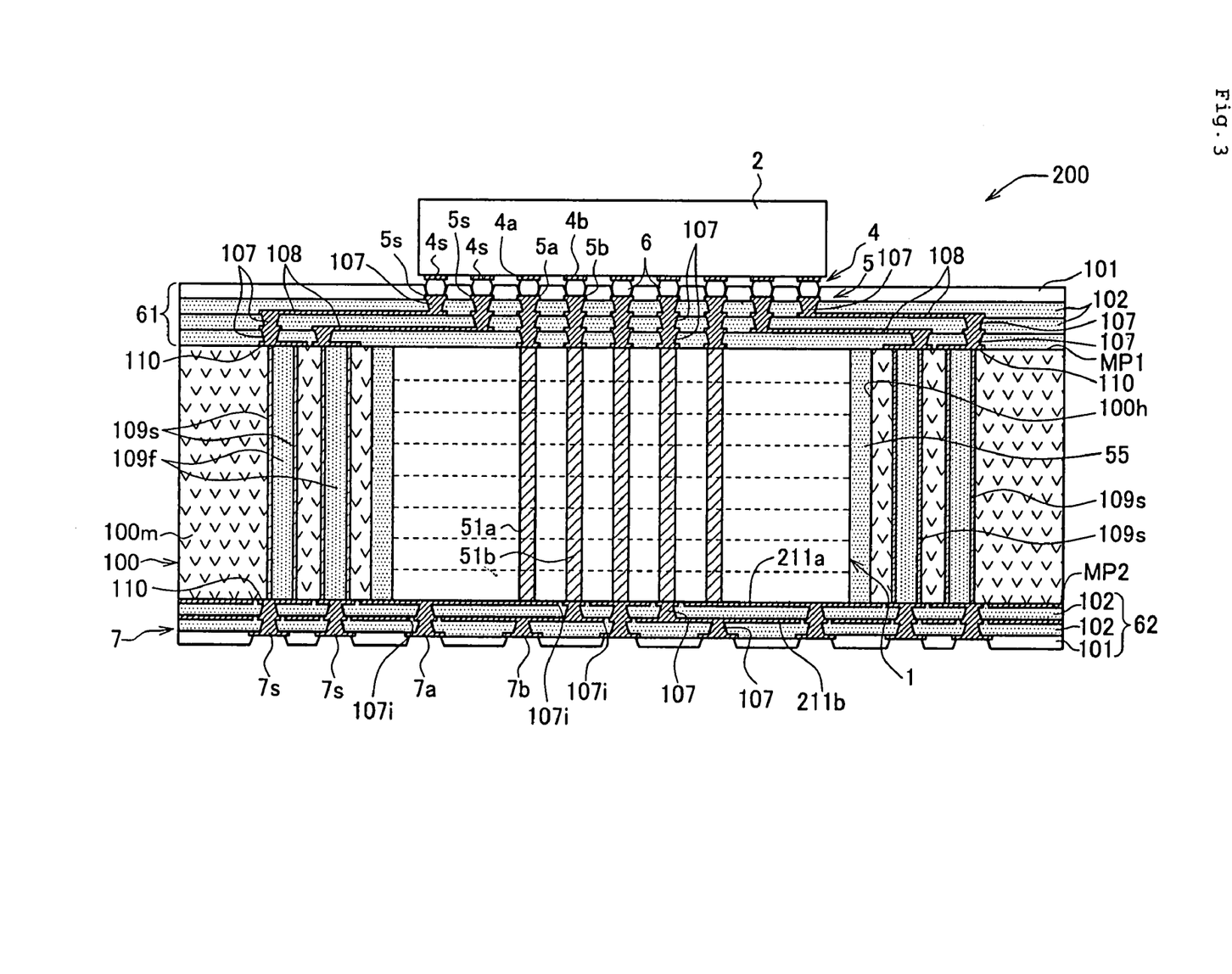
FIG. 3 is a schematic cross-sectional view of a first embodiment of intermediate substrate of the invention.

As shown in FIG. 3, the intermediate substrate 200 comprises a substrate core 100 comprised of a core main body 100*m* made of a polymeric material in a plate form, i.e., a planar polymeric main body 11*m*, and defining a sub-core compartment 100*h* in such a manner as to decrease the thickness thereof in the first principal surface. Substrate 200 also comprises a ceramic sub-core section 1 made of ceramics in a plate form, i.e., a planar ceramic sub-core section 1. Section 1 is accommodated in the sub-core compartment 100*h* so that the thickness thereof matches that of the core main body 100*m*. The first principal surface side of the substrate core 100 has a first terminal array 5 comprised of a first side first type terminal 5*a* and a first side second type terminal 5*b*, functioning as power source terminal and ground terminal, respectively, and a first side signal terminal 5*s*.

The first terminal array 5 is positioned so as to be entirely included in a projected area of the ceramic sub-core section 1 projected orthogonally onto a reference plane parallel to the planar surface of the substrate core 100. In other words, all of the terminals, i.e., the first side first type terminal 5*a*, first side second type terminal 5*b*, and first side signal terminal 5*s*, are joined to the semiconductor integrated circuit device 2 (and, more specifically, to the device side terminal array 4) on the ceramic sub-core section 1, by a flip-chip connection. As a result, for all terminals in the first terminal array 5, the difference in the coefficient of linear expansion from the semiconductor integrated circuit device side is significantly reduced, and terminal disconnection due to thermal stress can be substantially suppressed. For the intermediate substrate 200 shown in FIG. 3, the ceramic sub-core section 1 is formed over a larger area than the corresponding region of the first terminal array 5, and the reduction of thermal stress is further enhanced.

The core main body 100*m* is of a plate or planar form comprised of, for example, a heat resistant resin planar member (for example, a bismaleimide-triazine resin member) or a fiber reinforced resin planar member (for example, a glass fiber reinforced epoxy resin).

The ceramic material of the ceramic sub-core section 1 is, for example, alumina (7 to 8 ppm/° C.), borosilicate glass, or a glass ceramic of lead borosilicate glass with 40 to 60 parts by weight of an inorganic ceramic filler, such as alumina. Other suitable ceramic materials include aluminum nitride, silicon nitride, mullite, silicon dioxide, and magnesium oxide. In general, the ceramic sub-core section 1 may be comprised of any material so long as the coefficient of linear expansion thereof is smaller than that of the core main body 100*m*, such as a compound material of a polymeric material and a ceramic (for example, a compound material of a polymeric material and a ceramic having a higher content ratio by weight of ceramic than the core main body). On the other hand, as reference technology, the ceramic sub-core section 1 may be replaced by a silicon sub-core section, from the viewpoint of the similarity in the coefficient of linear expansion to the semiconductor device.

The ceramic of the ceramic sub-core section may be made of glass material, for example, a silica glass having a skeletal component made of silicon dioxide (silica). In this case, in order to adjust the physical properties thereof so as to be suited to its application as a ceramic dielectric, various glass additive components other than $SiO_2$ can be blended into the composition. From the viewpoint of enhancing the fluidity of the fused glass and suppressing the foam residue, the glass material is preferably blended with medium dissolving components such as $Na_2O$, $K_2O$, $Li_2O$, or other alkaline metal oxide, or $B_2O_3$ (boric acid). The addition of BaO, SrO or other alkaline earth metal oxide may enhance the dielectric characteristic of the glass material. But if too much is added, the coefficient of linear expansion of the glass may be increased, thereby increasing the difference in the coefficient of linear expansion from the component side, so that disconnection due to thermal stress may be more likely to occur. Further, due to the elevation of glass softening point, the decrease in fluidity is extreme, and the production of residual foams may be increased.

To suppress any increase in the coefficient of linear expansion of glass, it is effective to increase the content of the $SiO_2$ component or to blend ZnO as glass additive component. On the other hand, oxides of Ti, Zr or Hf are effective in enhancing the dielectric characteristic of glass or in improving the water resistant property of glass. Excessive additions of these may, however, lead to elevation of the glass softening point, an extreme drop in fluidity, and an increase in residual foams.

A silica glass material (oxide glass material) has a Si content of between 68 mass % and 99 mass % as converted to the amount of $SiO_2$, and cation components other than Si are comprised of oxide forming cations for forming oxides (hereinafter referred to as oxides for adjusting the coefficient of linear expansion) having a larger coefficient of linear expansion than $SiO_2$ in a temperature range from room temperature to 200° C. Hence, by using a material having an average coefficient of linear expansion from 1 ppm/° C. for room temperature to 200° C. which is adjusted to a value between 1 ppm/° C. and 7 ppm/° C., the coefficient of linear expansion of the glass material can be freely adjusted at 1 ppm/° C. or more, depending on the type and content of the oxide component (i.e., the component having a coefficient of linear expansion larger than that of $SiO_2$). As a result, the content of the ceramic sub-core section 1 can be adjusted so as to substantially reduce the difference between the coefficient of linear expansion thereof and that semiconductor component 2 to be mounted thereon.

When the semiconductor integrated circuit device 2 is a Si semiconductor component (having an average coefficient of linear expansion for temperatures from room temperature to 200° C. of 3 ppm/° C.), the coefficient of linear expansion of the silica glass material is preferably adjusted to be between 1 ppm and 6 ppm, and more preferably between 2 ppm/° C. and 5 ppm/° C. The semiconductor integrated circuit device 2 can be also comprised of a compound semiconductor component made of a group III–V compound of lattice matching with GaAs (for example, a GaAs system next-generation high speed CPU or MMIC (monolithic microwave integrated circuit)), but, in this case, because the coefficient of linear expansion of the semiconductor is about 5 to 6 ppm/° C., the coefficient of linear expansion of silica glass material is preferred to be adjusted to between 4 ppm/° C. and 7 ppm/° C.

Oxides having a coefficient of linear expansion larger than that of $SiO_2$ include, among others, alkaline metal oxides ($Na_2O$, $K_2O$, $Li_2O$: 20 to 50 ppm/° C.), alkaline earth metal oxides (BeO, MgO, CaO, SrO, BaO: 8 to 15 ppm/° C.), ZnO (6 ppm/° C.), and $Al_2O_3$ (7 ppm/° C.), and a suitable material may be selected based on factors such as dielectric characteristic, melting point, and glass fluidity. The content of $SiO_2$ is adjusted in a range of between 68 mass % and 99 mass % (and, preferably between 80 mass % and 85 mass %) in order to control the coefficient of linear expansion within the specified range, and the balance thereof may be comprised of the abovementioned oxides for adjusting the coefficient of linear expansion.

A specific example of glass composition applicable in implementation of a preferred embodiment of the invention is as follows: $SiO_2$: 80.9 mass %, $B_2O_3$: 12.7 mass %, $Al_2O_3$: 2.3 mass %, $Na_2oO$: 4.0 mass %, $K_2O$: 0.04 mass %, $Fe_2O_3$: 0.03 mass %, softening point: 821° C., and coefficient of linear expansion (average for temperature ranging from 20° C. to 200° C.): 3.25 ppm/° C.

The second principal surface side of the substrate core 100 includes the second terminal array 7 comprised of a second side, first type terminal 7a and second side, second type terminal 7b which is conductively connected to, a first side, first type terminal 5a and a first side, second type terminal 5b. A second side signal terminal 7s is conductively connected to a first side signal terminal 5s. The first terminal array 5 is formed, with respect to the relative position thereof, so as to be entirely included within the projected area of the ceramic sub-core section 1, in an orthogonal projection on a reference plane (for example, to be determined by the first principal surface MP1 of the substrate core 100) parallel to the planar surface of the substrate core 100. In other words, if sub-core section 1 is geometrically projected orthogonally into a plane parallel to the planar surface of core 100, terminal array 5 would lie entirely within the projected area. The space defined by the gap formed between the ceramic sub-core section 1 and core main body 100m in the sub-core compartment 100h is filled with a filling and bonding layer 55 made of a polymeric material. This filling and bonding layer 55 serves to affix the ceramic sub-core section 1 to the core main body 100m, and to absorb, by its own elastic deformation, the effects of the difference in the coefficient of linear expansion in the in-plane direction and the thickness direction between the ceramic sub-core section 1 and the core main body 100m.

Figure 2:
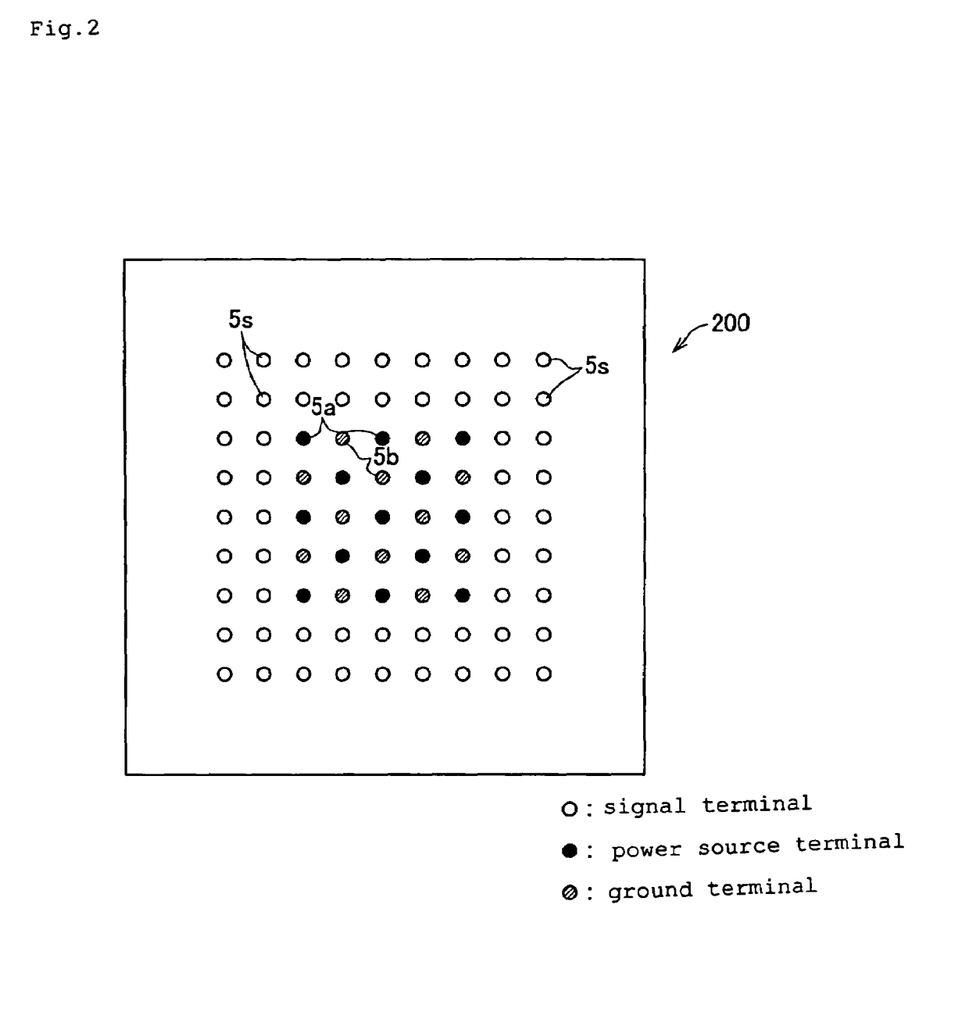
FIG. 2 is a top plan view showing one embodiment of a first terminal array of the intermediate substrate of FIG. 1.

As shown in FIG. 2, in the first terminal array 5, the first side, first type terminals 5a and first side, second type terminals 5b are disposed in a mutually alternating lattice or grid form (or, alternatively, in a zigzag form). Similarly, in the second terminal array 7, the second side, first type terminals 7a and second side, second type terminals 7b are disposed in mutually alternating lattice or grid form (or, alternatively in a zigzag form), corresponding to the terminal layout of the first terminal array 5. In both arrays 5 and 7, a plurality of first side signal terminals 5s and second side signal terminal 7s are formed in such manner as to enclose or form an external border around the lattice or grid layout of the power source terminals and ground terminals.

In FIG. 3, the substrate core 100 is covered with a first wiring laminated section 61 (constituting so-called "build-up" wiring layers) comprising, in an alternately laminated construction a dielectric layer 102 made of a polymeric material, and a conductor layer including a surface conductor used as a wiring, ground or power source, in the first major or principal surface of the ceramic sub-core section 1, together with the first principal surface of the core main body 100m. The first terminal array 5 is exposed and formed in the first principal surface (MP1) of the first wiring laminated section 61. In this configuration, because the ceramic sub-core section 1 is covered by the first wiring laminated section 61, in a batch, together with the core main body 100m. The first wiring laminated section 61 and the first terminal array 5 can be formed in essentially the same process as the general build-up organic package substrate. This contributes to simplification of the manufacturing process.

The second principal surface (MP2) of the substrate core 100 is covered with a second wiring laminated section 62 comprising, in an alternately laminated construction, a dielectric layer 102 made of polymeric material, and a conductor layer including a surface conductor used as a wiring, ground or power source, and the second terminal array 7 is exposed and formed in the first principal surface of the second wiring laminated section 62.

In either of the wiring laminated sections 61 and 62, the dielectric layer 102 can comprise a build-up layer made of epoxy resin or other resin composition, and formed so as to have a thickness of, for example, between 20 μm and 50 μm. In this embodiment, the dielectric layer 102 is composed of epoxy resin, and a conductive filler made of $SiO_2$ is blended in a ratio of between 10 mass % and 30 mass %, and the dielectric constant, $\in$, is adjusted to be about 2 to 4 (for example, about 3). The conductor layer is, whether in wiring or in a surface conductor, formed as pattern plating layer (for example, an electrolytic Cu plating layer) on the dielectric layer 102, and having a thickness of, for example, between 10 μm and 20 μm.

In FIG. 3, corresponding to the first side, first type terminal 5*a* and first side, second type terminal 5*b* of the first terminal array 5, and conductively connected to the second side, first type terminal 7*a* and second side, second type terminal 7*b* of the second terminal array 7, respectively, a first type sub-core conductor 51*a* and a second type sub-core conductor 51*b* are formed in the thickness (transverse) direction of the ceramic sub-core section 1. The first type sub-core conductor 51*a* and second type sub-core conductor 51*b* are formed so as to be conductively connected to the first side, first type terminal 5*a* and first side, second type terminal 5*b*, respectively, by way of a via conductor 107 formed so as to penetrate through the dielectric layers 102 of the first wiring laminated section 61. By forming the conductors 51*a*, 51*b* serving as a ground and power source in parallel in the ceramic sub-core section 1, the ground path and power source both have decreased inductance, and hence decreased impedance. The first type sub-core conductor 51*a* and second type sub-core conductor 51*b* are bonded to a second side, first type surface conductor 211*a* and a second side, second type surface conductor 211*b* in the second wiring laminated section 62, respectively, by way of the via conductor 107. The second side, first type terminal 7*a* and second side, second type terminal 7*b* of the second terminal array 7 are connected to the second side first type surface conductor 211*a* and second side, second type surface conductor 211*b*.

In constructing the ceramic sub-core section 1, by laminating and baking a known ceramic green sheet containing a powder material having a constitutive ceramic, and via holes formed by punching or laser piercing and filled with metal powder paste, the sub-core conductors 51*a*, 51*b* mentioned above (and also conductor 51*s* mentioned below) are formed as laminated vias.

The via conductors 107 of the wiring laminated sections 61, 62 are formed by piercing via holes in the dielectric layer 102 by a known method such as a photo via process (wherein the dielectric layer 102 is comprised of a photosensitive resin composition, for example, an ultraviolet curing epoxy resin), or a laser piercing via process (wherein the dielectric layer 102 is comprised of a non-photosensitive resin composition), and filling or covering the inside of the via hoes with a via conductor by plating or the like. The wiring laminated sections 61, 62 are covered with solder resist layers 101 comprised of a photosensitive resin composition in such a manner as to expose the terminal arrays 5, 7.

As shown in FIG. 2, in the first terminal array 5 (and second terminal array 7), the first side, first type terminal 5*a* and first side, second type terminal 5*b* are disposed in an inside array region, and the first side signal terminal 5*s* is disposed in an outside array region. As shown in FIG. 3, in the first wiring laminated section 61, a first side signal wiring 108 for leading the signal transmission path to the outside of the forming region of the ceramic sub-core section 1 is provided in a manner so as to be conductively connected to the first side signal terminal 5*s*. The terminal end of the first side signal wiring 108 is conductively connected to a signal a through-hole conductor 109*s* formed in the thickness (transverse) direction of the core main body 100*m* in such a manner to "turn away" from the ceramic sub-core section 1.

In the device side terminal array 4 of the semiconductor integrated circuit device 2, signal terminals 4*s* are disposed at closely spaced intervals which are the same as those for terminals 4*a*, 4*b* for the power source and ground, and the signal terminals 4*s* positioned on the outer circumference of the array are disposed out of the ceramic sub-core 1, in most cases, because the increased distance in the in-plane direction to the corresponding second side signal terminal 7*s* of the second terminal array formed at the reverse side of the intermediate substrate 200. However, in this configuration, the device side signal terminals 4*s* and first side signal terminals 5*s* which are connected by a solder connection, can be positioned immediately above the ceramic sub-core section 1 where the reduction in the effect of the difference in the coefficient of linear expansion is substantial, and a conductive connection can be provided to the second side signal terminals 7*s* located at a sufficiently remote distance way without any problem.

The through-hole conductor formed in the core main body 100*m* has a greater diameter in axial cross section than the via conductors 107 formed in the wiring laminated sections 61, 62. Such a through-hole conductor is formed by piercing a through-hole, for example, in the core main body 100*m* so as to penetrate in the plate thickness (transverse) direction by means of drilling or the like, and covering the inside of the through-hole with a metal layer by Cu plating or the like. The inside of the through-hole conductor is filled with a resin filling material 109*f* made of an epoxy resin or the like. Both ends of the through-hole conductor are sealed by conductor pads 110. When it is desired to eliminate the direct-current connection between the via conductor 107 or conductor pad 110, and a surface conductor such as the power source layer or ground layer, a hole 107*i* is formed in the surface conductor, and the via conductor 107 or conductor pad 110 is disposed at the inside across an annular gap.

In the intermediate substrate 200 of FIG. 3, the sub-core compartment 100*h* is formed so as o penetrate through the core main body 100*m*, and the second wiring laminated section 62 is formed so as to be in contact with the second principal surface of the ceramic sub-core section 1 accommodated in the sub-core compartment 100*h*. With this configuration, since the core main body 100*m*, which is principally comprised of a polymeric material having a large coefficient of linear expansion, is moved from the position of the ceramic sub-core section 1, a reduction in the difference in the coefficients of linear expansion between the semiconductor integrated circuit device 2 and intermediate substrate 200 can be more readily achieved.

Figure 4:
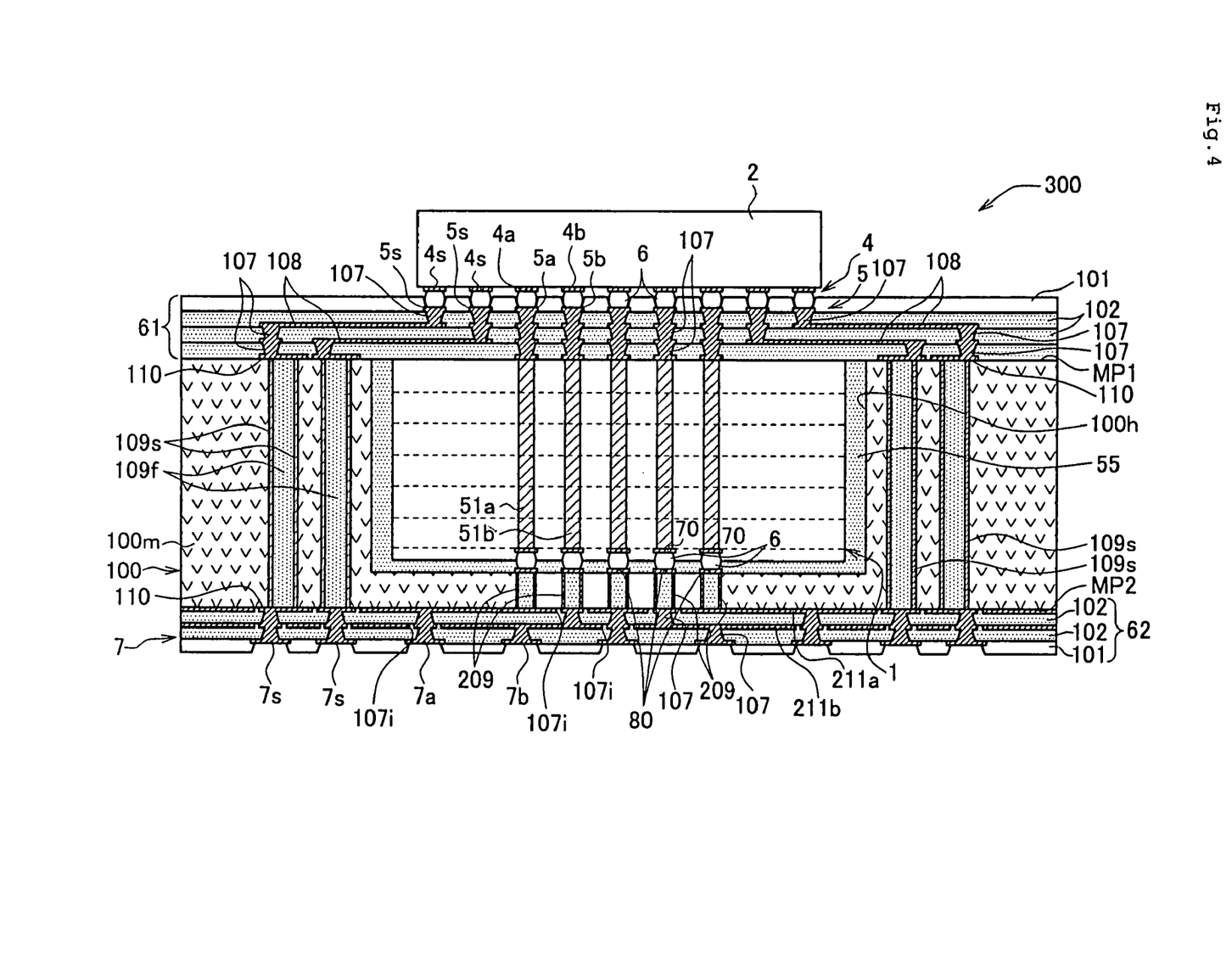
FIG. 4 is a schematic cross-sectional view of a second embodiment of the same.

Various modifications of the intermediate substrate of the invention are described below. In the following configurations, the portions thereof which are formed in the same way as the intermediate substrate 200 of FIG. 3 are identified with the same reference numerals, and any detailed description thereof is omitted. Referring to FIG. 4, an intermediate substrate 300 has a sub-core compartment 100h in the form of a recess with a bottom portion opening at the first principal surface of the core main body 100m. A second wiring laminated section 62 is formed in contact with the second principal surface of the core main body 100m at the opposite side of the recess. With this construction, since the ceramic sub-core section 1 is not exposed to the second principal surface side of the core main body 100m, the flat second wiring laminated section 62 can be more easily formed. More specifically, a plurality of bottom through-hole conductors 209 each conductively connected to a respective terminal of the second terminal array 7 are formed in such a manner as to penetrate through the bottom portion of the sub-core compartment 100h of the core main body 100m, and the sub-core conductors 51a, 51b formed in the ceramic sub-core section 1 are conductively connected to the bottom through-hole conductors 209. More specifically, for each connection, a pad 80 on the side of the bottom through-hole conductors 209 and a pad 70 on the sub-core conductor side are joined by a "flip-chip" connection produced by a solder junction 6.

Figure 5:
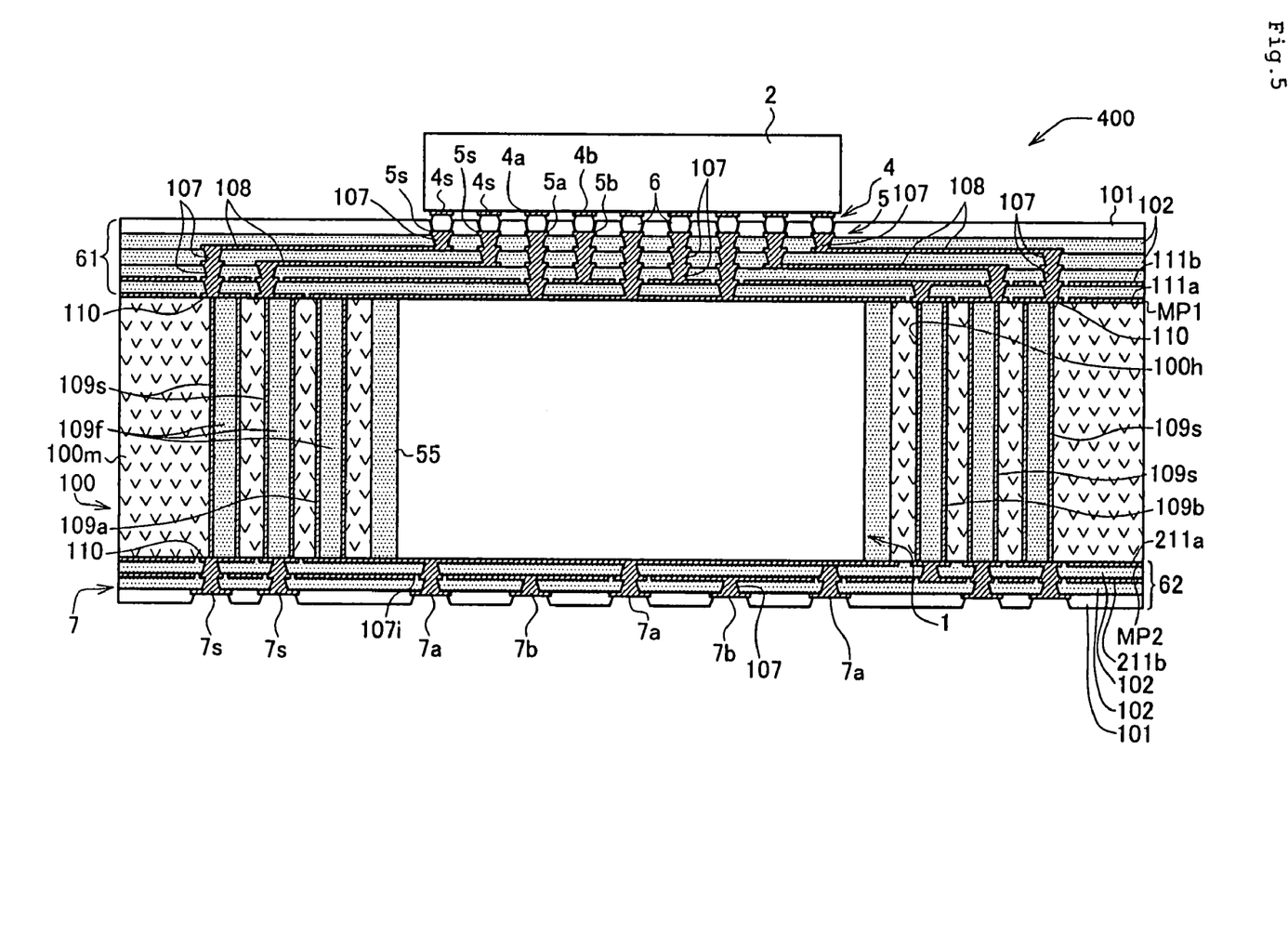
FIG. 5 is a schematic cross-sectional view of a third embodiment of the same.

Referring to FIG. 5, an intermediate substrate has a structure in which a first side, first type surface conductor 111a and a first side, second type surface conductor 111b are conductively connected, respectively, to first side, first type terminal 5a and first side, second type terminal 5b of the first terminal array 5 covering the first principal surface of the core main body 100m, together with the ceramic sub-core section 1, as part of a first wiring laminated section 61. The first side, first type surface conductor 111a and first side, second type surface conductor 111b are conductively connected, respectively, to a first type through-hole conductor 109a and a second type through-hole conductor 109b formed in the thickness (transverse) direction of the core main body 100m in such a manner as to turn away from, i.e., to be disposed outwardly of, the ceramic sub-core section 1. With this configuration, the sub-core conductor is conductively connected to the first side, first type terminal 5a and first side, second type terminal 5b is not formed in the ceramic sub-core section 1. The metal used for this conductor arrangement, such as Cu, has a relatively high coefficient of linear expansion, but in this construction, because the volume of the metallic sub-core conductor can be decreased, the average coefficient of linear expansion of the entire ceramic sub-core section 1 can be reduced, and a reduction in the effect of the difference in the coefficients of linear expansion between the semiconductor integrated circuit device 2 and the intermediate substrate 200 can be readily achieved. The first type through-hole conductor 109a and the second type through-hole conductor 109b are coupled to second side, first type surface conductor 211a and the second side, second type surface conductor 211b of the second wiring laminated section 62 through via conductors 107.

With this construction, considering the first terminal array 5, as shown in FIG. 2, when the first side, first type terminal 5a and first side, second type terminal 5b are disposed in the inside array region as shown, and the first side signal terminals 5s are disposed in the outside array outside, in the same manner as shown in FIG. 3, a first side signal wiring element 108 for leading the signal transmission path out to a location outside of the region of the ceramic sub-core section 1 can be provided in a first wiring laminated section 61a manner so as to provide a conductive connection to the first side signal terminal 5s. The terminal end of the first side signal wiring 108 is conductively connected to a through-hole conductor for the signal through-hole conductor 109s extending in the thickness (transverse) direction of the core main body 100m in a manner disposed outwardly of the ceramic sub-core section 1. With this construction, the sub-core conductor can be located completely apart from the ceramic sub-core section 1, and can be comprised of a solid ceramic plate, and as a consequence, reduction of the effect of the difference in the coefficients of linear expansion between the semiconductor integrated circuit device 2 and the intermediate substrate 200 is provided, and the manufacturing process for making the ceramic sub-core section 1 can be substantially simplified.

Figure 6:
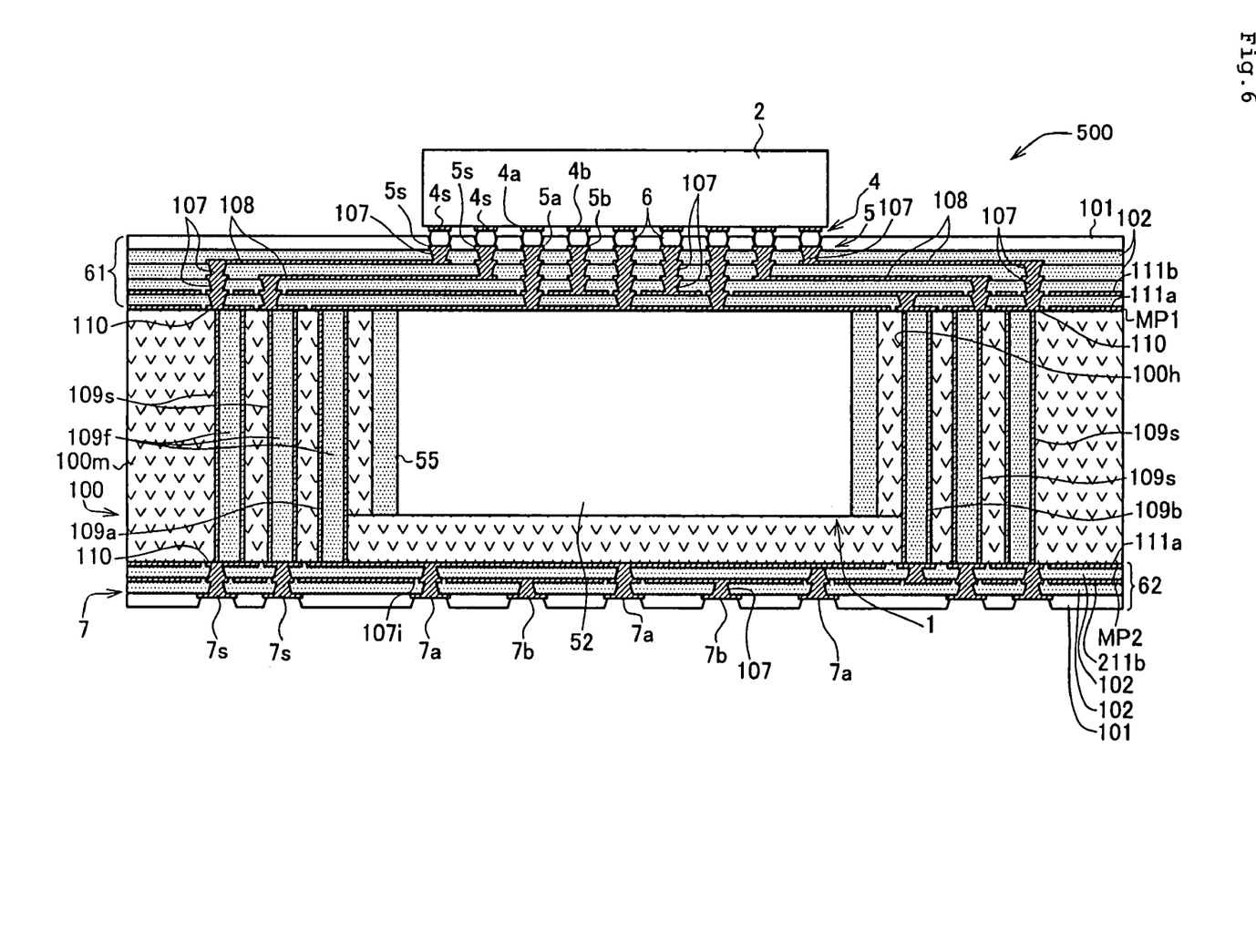
FIG. 6 is a schematic cross-sectional view of a fourth embodiment of the same.

Referring to FIG. 6, an intermediate substrate 500 is formed using the intermediate substrate 400 of FIG. 5, and by forming the sub-core compartment 100h as a recess with a bottom portion opening at the first principal surface of the core main body 100m, in the same manner as the intermediate substrate 300 in FIG. 4. In FIG. 6, the sub-core conductor arrangement is not formed in the ceramic sub-core section 1, and hence there are no through-hole conductors corresponding to the bottom through-hole conductor 209 of FIG. 4, formed in the portion of core main body 100m forming the bottom of the sub-core compartment 100h.

Figure 7:
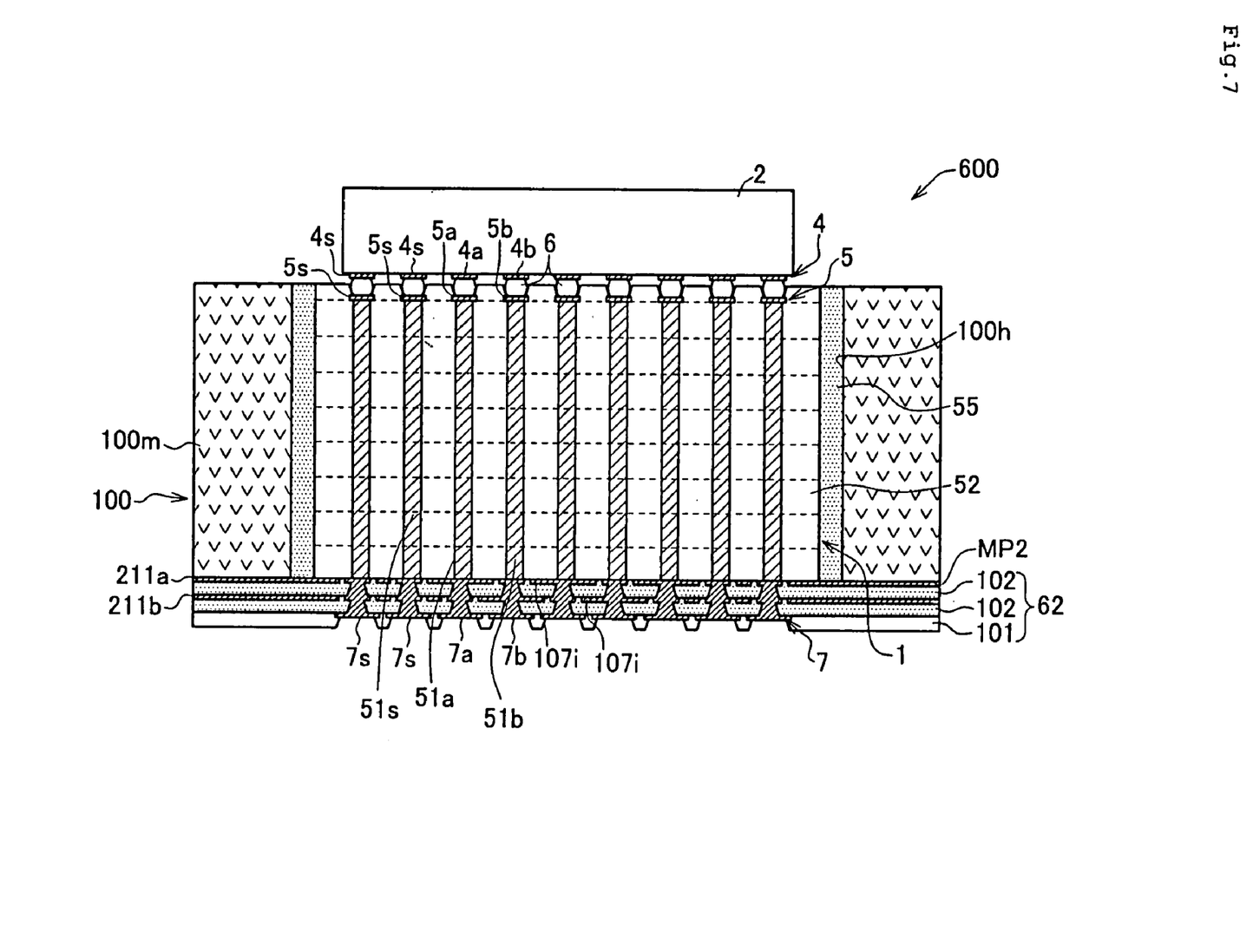
FIG. 7 is a schematic cross-sectional view of a fifth embodiment of the same.

Referring to FIG. 7, in an intermediate substrate 600 shown in FIG. 7, the first side, first type terminal 5a and first side, second type terminal 5b comprising the first terminal array 5 are exposed and formed on the first principal surface of the ceramic sub-core section 1. Corresponding respectively to the first side, first type terminal 5a and first side, second type terminal 5b of the first terminal array 5, and conductively connected, respectively, with the second side, first type terminal 7a and the second side, second type terminal 7b of the second terminal array 7, the first type sub-core conductor 51a and the second type sub-core conductor 51b are formed in the thickness (transverse) direction of the ceramic sub-core section 1. In this configuration, the first wiring laminated section 61 of previous embodiments, which is mainly comprised of polymeric material, is omitted and thus is not disposed no the first principal surface of the ceramic sub-core section 1 as in previous embodiments, and the semiconductor integrated circuit device 2 and the ceramic sub-core section 1 are directly coupled together by means of the solder junction 6. As a result, the reduction of the effect of the differences in coefficient of linear expansion between the semiconductor integrated circuit device 2 and intermediate substrate 600 is further enhanced. Because the wiring connected to the terminals is not disposed immediately above the ceramic sub-core section 1, the inductance of the transmission path connecting the terminals is lowered, and hence the impedance is lowered. In the intermediate substrate 600 of this embodiment, there is no first side wiring laminated section.

In the intermediate substrate 600 of FIG. 7, the first side signal terminals 5s comprising the first terminal array 5 are exposed, and formed on the first principal surface of the ceramic sub-core section 1, and corresponding to the first side signal terminals 5s, and connected to the second side signal terminals 7s of the second terminal array 7, the sub-core signal conductors 51s are also formed in the thickness (transverse) direction of the ceramic sub-core section 1. This configuration can be achieved using a construction wherein the terminal distance, i.e., the spacing between the first terminal array 5 is not as close as in other embodiments, and wherein the sub-core conductors 51s are formed as signal terminals, so that a low inductance and a low impedance can be realized not only in the transmission path for ground and the power source, but also in the signal transmission path.

Figure 11:
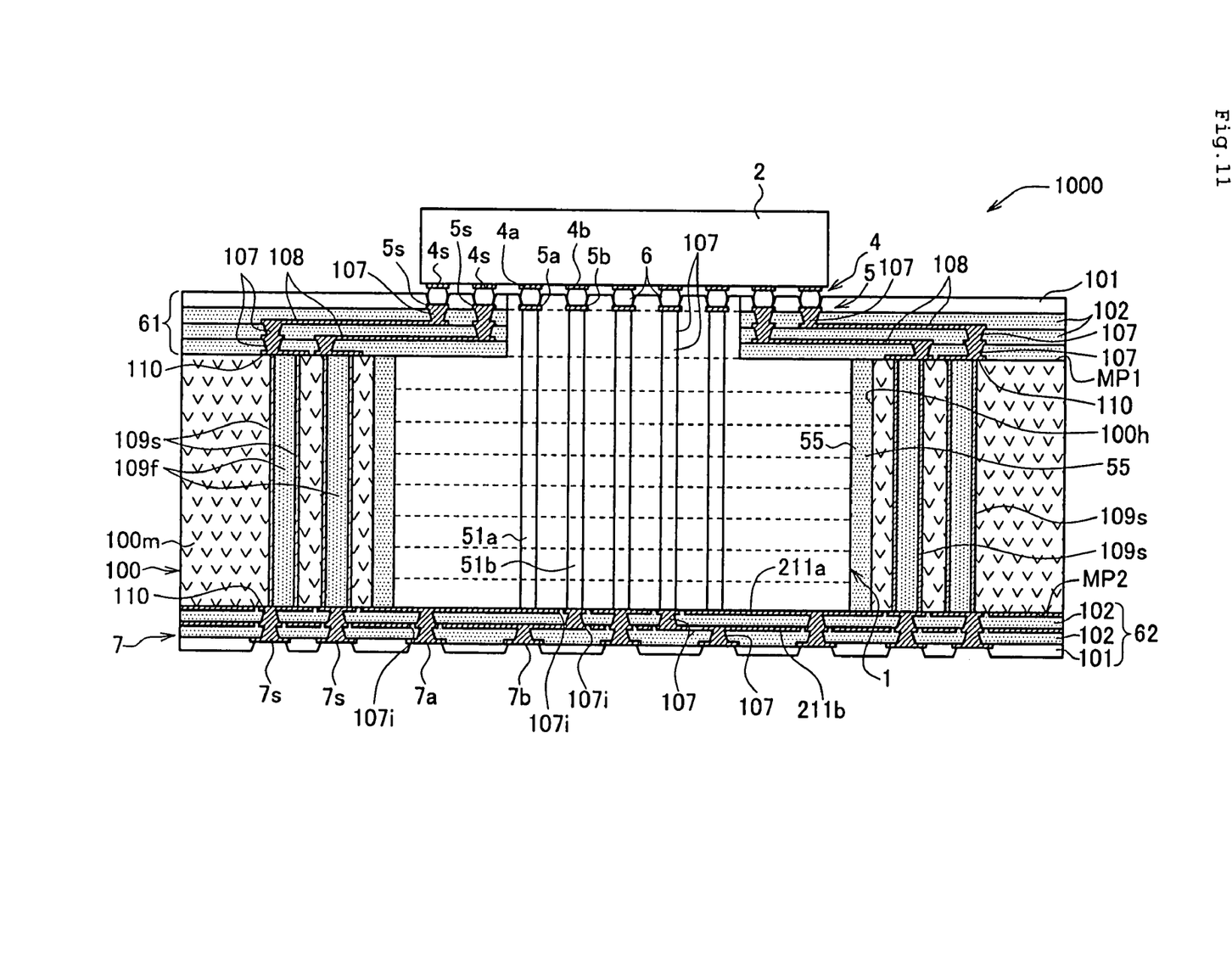
FIG. 11 is a schematic cross-sectional view of a ninth embodiment of intermediate substrate of the invention.

On the other hand, referring to FIG. 11, in an intermediate substrate 1000 as shown in FIG. 11, the outer periphery of the first principal surface of the ceramic sub-core section 1 is covered with a first wiring laminated section 61 comprising an alternately laminated dielectric layer 102 made of a polymeric material and conductor layer including a surface conductor for wiring or ground or for a power source, together with the first principal surface of the core main body 100m. The first side signal terminal 5s is exposed and formed on the surface of the first wiring laminated section 61. In a manner which provides an electrical connection to the first side signal terminals 5s, a first side signal wiring element or conductor 108 for leading the signal transmission path to the outside of the forming region of the ceramic sub-core section 1 is provided in the first wiring laminated section 61. The terminal end of the first side signal wiring element 108 is connected to a signal through-hole conductor 109s formed in the thickness (transverse) direction of the core man body 100m so as to be located outwardly of the ceramic sub-core section 1. This configuration is advantageous in a construction wherein the terminal distance between the terminals of the first terminal array 5 is small because the wiring connected to the signal terminal on the outer periphery of the array 5 can be widely distributed inwardly and outwardly of the plane.

Figure 8:
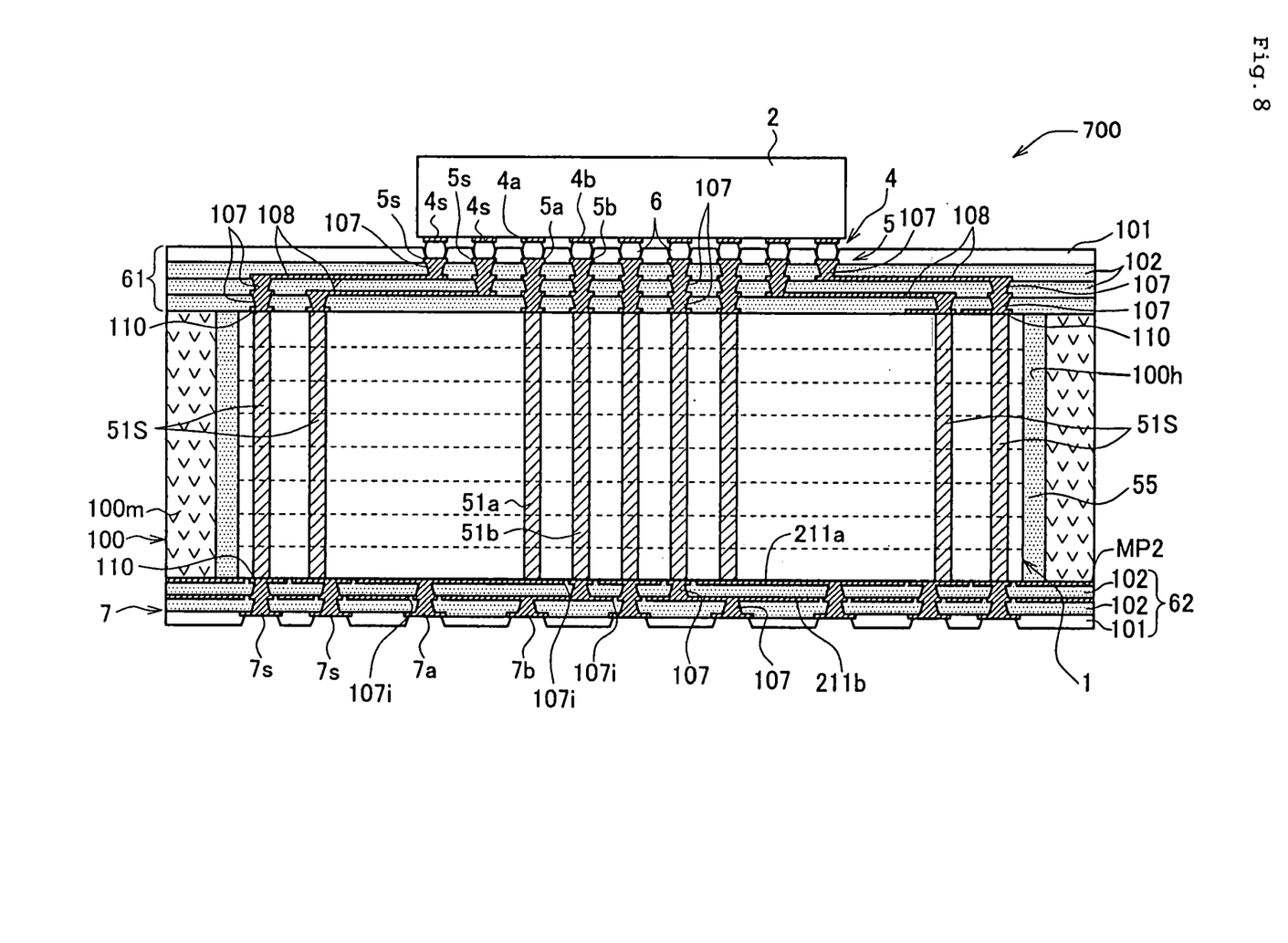
FIG. 8 is a schematic cross-sectional view of a sixth embodiment of the same.

Turning to FIG. 8, in an intermediate substrate 700 shown in FIG. 8, the ceramic sub-core section 1 of the wiring board 200 in FIG. 3 is extended further inwardly of the plane, and the sub-core signal conductors 51s corresponding to the first side signal terminals 5s of the first terminal array 5 and second side signal terminals 7s of the second terminal array 7 are formed in the thickness (transverse) direction of the sub-core section 1.

Figure 9:
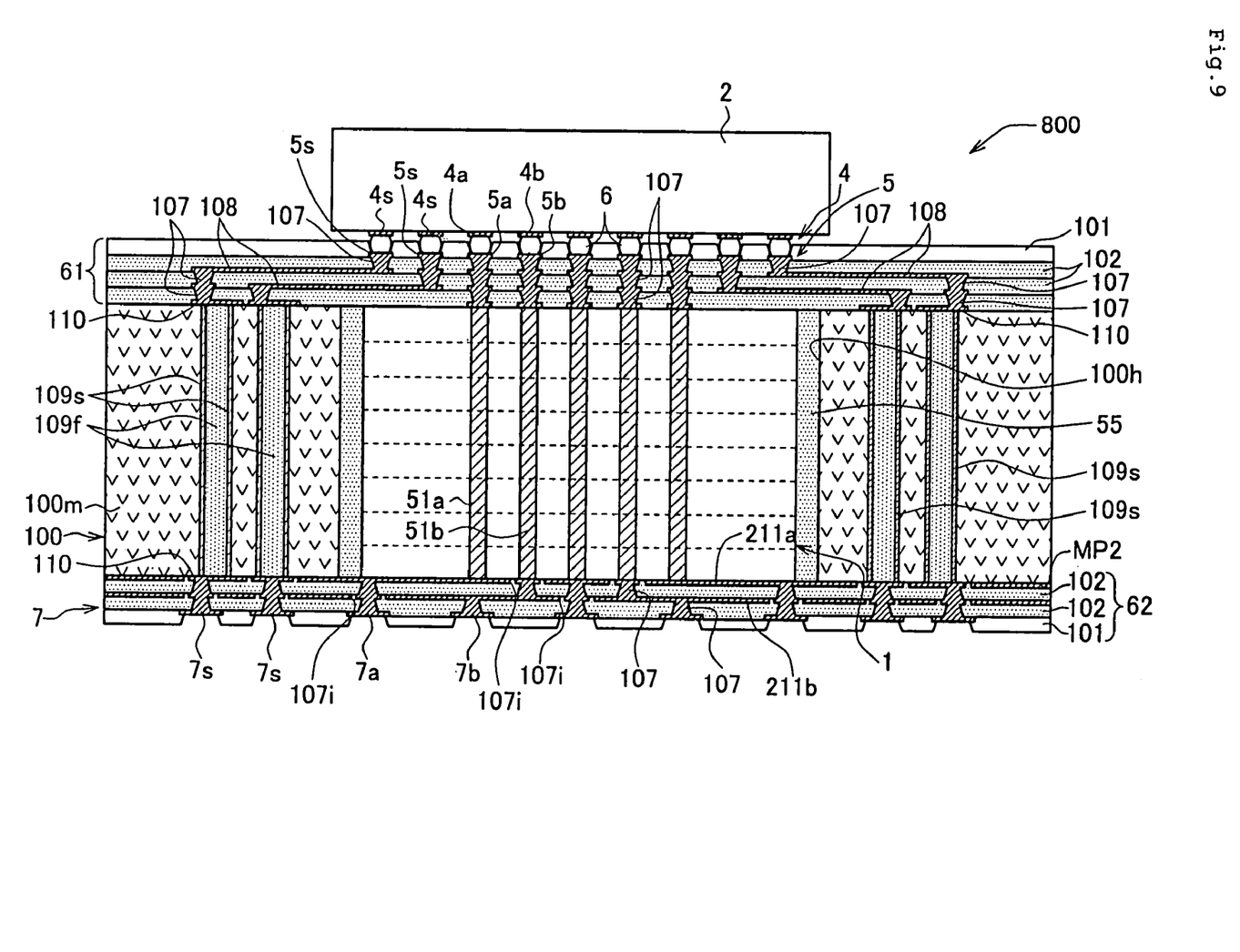
FIG. 9 is a schematic cross-sectional view of a seventh embodiment of intermediate substrate of the invention.
Figure 10:
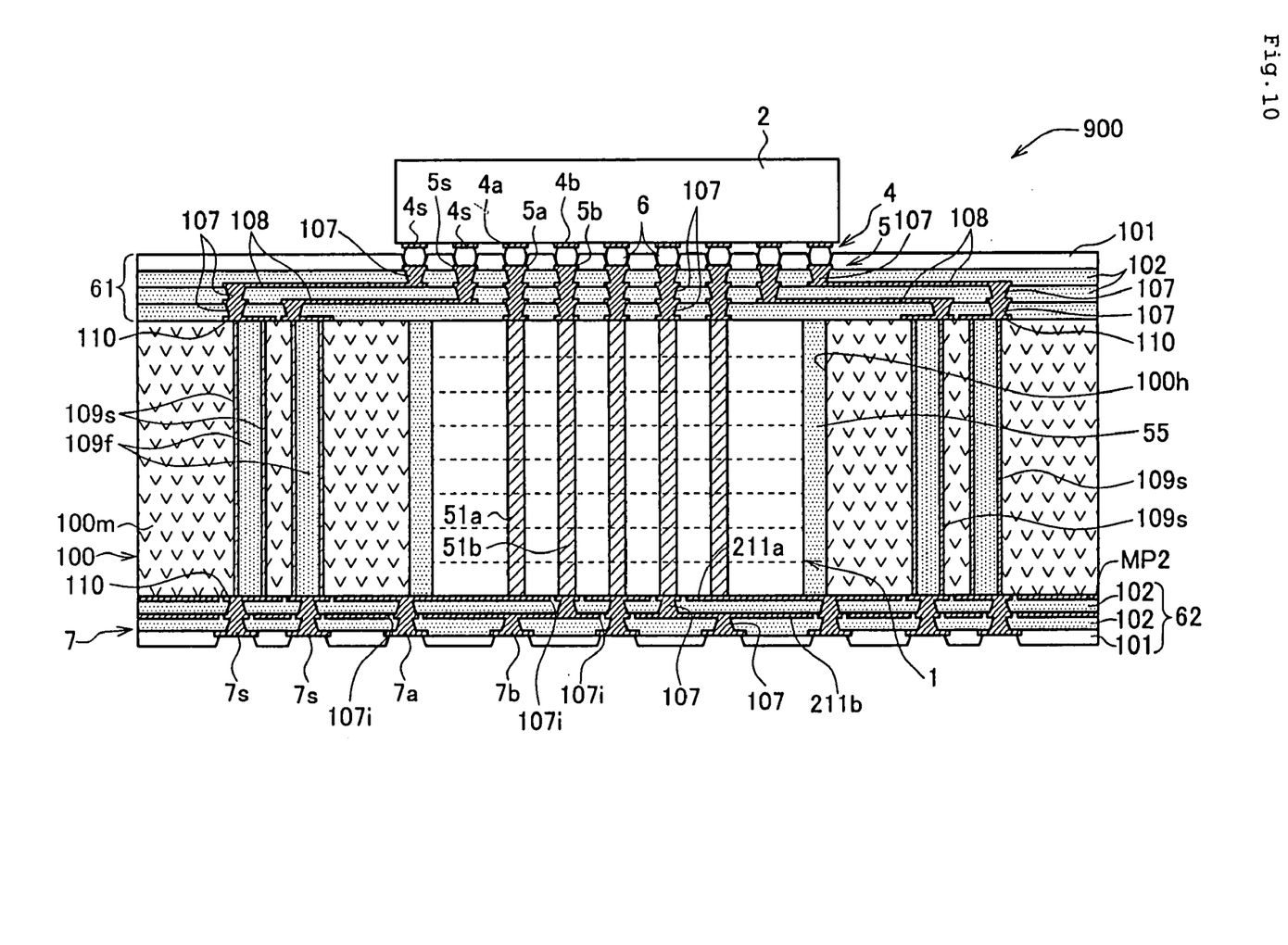
FIG. 10 is a schematic cross-sectional view of an eighth embodiment of intermediate substrate of the invention.

In these embodiments, the sub-core section 1 is formed so as to have a larger area than the semiconductor integrated circuit device 2, but the sub-core section 1 may be formed so as to have an area which is nearly equivalent to a projected region of the semiconductor integrated circuit device 2. Further, referring to FIG. 9, as shown for the intermediate substrate 800 of FIG. 9, all of the terminals of the first terminal array 5 may be formed within the projected region of the sub-core section 1, and the sub-core section 1 may be formed so as to have a smaller area than the semiconductor integrated circuit device 2. Moreover, referring to FIG. 10, to the extent that there is no serious effect on the connection provided by the solder junction 6 to the terminals positioned outside of the semiconductor integrated circuit device 2, as provided in the intermediate substrate 900 shown in FIG. 10, it is possible for the sub-core section 1 to even be of a smaller area than the area or region of the first terminal array 5.

Although the invention has been described above in relation to preferred embodiments thereof, it will be understood by those skilled in the art that variations and modifications can be effected in these preferred embodiments without departing from the scope and spirit of the invention.

What is claimed is:

1. An intermediate substrate comprising:
a substrate core, having first and second principal surface sides, comprised of a plate-form main core body made of a polymeric material and including a sub-core compartment formed therein so as to decrease the overall thickness thereof relative to a first planar principal surface, and a plate-form sub-core section made of a material having a coefficient of linear expansion smaller than that of the main core body, said sub-core section being accommodated in the sub-core compartment and having a thickness matching the overall thickness of the main core body;
a first terminal array comprised of a first side first type terminal and a first side second type terminal formed at the first principal surface side of the substrate core, and functioning as a power source terminal and a ground terminal, and of a first side signal terminal, and
a second terminal array comprised of a second side first type terminal and a second side second type terminal formed at the second principal surface side of the substrate core, and conductively connected to, respectively, the first side first type terminal and the first side second type terminal, and of a second side signal terminal conductively connected to the first side signal terminal,
the first terminal array being disposed in a relative position overlapping a projected region of the sub-core section geometrically projected orthogonally onto a reference plane parallel to the planar principal surface of the substrate core.

2. An intermediate substrate comprising:
a substrate core, having first and second principal surface sides, comprised of a plate-form main core body made of a polymeric material, and including a sub-core compartment formed therein so as to decrease the thickness thereof relative to a first planar principal surface, and a plate-form sub-core section made of a material having a coefficient of linear expansion smaller than the core main body formed in a plate, said sub-core section being accommodated in the sub-core compartment and having a thickness matching the overall thickness of said main core body,
a first terminal array comprised of a first side, first type terminal and a first side, second type terminal formed at the first principal surface side of the substrate core, and functioning, respectively, as a power source terminal and a ground terminal, and of a first side signal terminal, and
a second terminal array comprised of a second side, first type terminal and a second side, second type terminal formed at the second principal surface side of the substrate core, and conductively connected to, respectively, the first side, first type terminal and the first side, second type terminal, and of a second side signal terminal conductively connected to the first side signal terminal,
the first terminal array being disposed in a relative position that is entirely included in a projected region of the sub-core section geometrically projected orthogonally onto a reference plane parallel to the planar principal surface of the substrate core.

3. The intermediate substrate of claim 1, wherein the substrate core is covered with a laminated first wiring section comprising, alternately laminated together, at least one dielectric layer made of polymeric material, and at least one conductor layer including a surface conductor which functions as a wiring connector, ground or a power source, said first wiring section being disposed on the first principal surface of the ceramic sub-core section and the first principal surface of the main core body, and the first terminal array being exposed and being formed in the first principal surface of the first wiring section.

4. The intermediate substrate of claim 3, further comprising a first type sub-core conductor and a second type sub-core conductor, corresponding to the first side, first type terminal and first side, second type terminal of the first terminal array, conductively connected to the second side, first type terminal and second side, second type terminal of the second terminal array, respectively, and extending transversely of the sub-core section, the first type sub-core conductor and second type sub-core conductor being conductively connected to, respectively, the first side, first type terminal and first side, second type terminal by a via conductor that penetrates through the at least one dielectric layer of the first wiring section.

5. The intermediate substrate of claim 3, further comprising a first side, first type surface conductor and a first side, second type surface conductor conductively connected to, respectively, the first side, first type terminal and first side, second type terminal of the first terminal array and disposed on the first principal surface of the core main body and the ceramic sub-core section in the first wiring section, and the first side, first type surface conductor and first side, second type surface conductor each extending away from the sub-core section and being conductively connected, respectively, to a first type through-hole conductor and a second type through-hole conductor each extending transversely through the core main body.

6. The intermediate substrate of claim 3, wherein, in the first terminal array, the first side first type terminal and first side second type terminal are disposed in an inside array region, and the first side signal terminal is disposed in an outside array region, and the first wiring section includes a first side signal wiring connection for providing a signal transmission path to a region outside of the sub-core section and being conductively connected to the first side signal terminal, and a terminal end of the first side signal wiring extending away from the sub-core section, and being conductively connected to a signal through-hole conductor extending transversely of the core main body.

7. The intermediate substrate of claim 1, wherein the first side, first type terminal and first side, second type terminal comprising the first terminal array are exposed and are formed on the first principal surface of the sub-core section, and a first type sub-core conductor and second type sub-core conductor, corresponding to the first side, first type terminal and first side, second type terminal of the first terminal array and conductively connected to the second side, first type terminal and second side, second type terminal of the second terminal array, extend transversely of the sub-core section.

8. The intermediate substrate of claim 7, wherein the first side signal terminals comprising the first terminal array are exposed and are formed on the first principal surface of the sub-core section, and signal sub-core conductors, corresponding to the first side signal terminals and conductively connected to the second side signal terminals of the second terminal array, extend transversely of the sub-core section.

9. The intermediate substrate of claim 7, wherein a first laminated wiring section covers the outer periphery of the first principal surface of the sub-core section, said first wiring laminated section comprising, alternately laminated together, at least one dielectric layer made of polymeric material and at least one conductor layer including a surface conductor functioning as a wiring or ground or as a power source connection together with the first principal surface of the main core body, said first side signal terminal being exposed and being disposed on the surface of the first wiring section, and the first wiring laminated section including a first side signal wiring for providing a signal transmission path outside of the sub-core section and being conductively connected to the first side signal terminals, and a terminal end of the first side signal wiring extending away from the sub-core section, and being conductively connected to a signal through-hole conductor extending transversely of the main core body.

10. The intermediate substrate of claim 1, wherein the sub-core section covers an area at least equal to a corresponding area covered by the first terminal array.

11. The intermediate substrate of claim 1, wherein the sub-core section comprises a ceramic sub-core section made of ceramic.

12. The intermediate substrate of claim 11, wherein said ceramic sub-core section comprises one of alumina and a glass ceramic.

* * * * *